United States Patent
Lin et al.

(10) Patent No.: US 10,736,244 B1
(45) Date of Patent: Aug. 4, 2020

(54) WEARABLE ELECTRONIC DEVICES HAVING MULTIPLE LAYERS OF ELECTROMAGNETIC SPECTRUM SPECIFIC PAINT FOR ENHANCED THERMAL PERFORMANCE

(71) Applicant: MICROSOFT TECHNOLOGY LICENSING, LLC, Redmond, WA (US)

(72) Inventors: Tzu-Yuan Lin, San Jose, CA (US); Douglas L. Heirich, Palo Alto, CA (US); Brian J. Toleno, Cupertino, CA (US); Gavin D. Stanley, Puyallup, WA (US); Sridhar Canumalla, Sammamish, WA (US); Sravan Kuman Reddy Gondipalli, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/571,059

(22) Filed: Sep. 13, 2019

(51) Int. Cl.
*H05K 7/20* (2006.01)
*G02B 27/01* (2006.01)
(Continued)

(52) U.S. Cl.
CPC ..... *H05K 7/20963* (2013.01); *G02B 27/0176* (2013.01); *G06F 1/203* (2013.01); *G06F 1/163* (2013.01)

(58) Field of Classification Search
USPC .................................................... 361/679.03
See application file for complete search history.

(56) References Cited

U.S. PATENT DOCUMENTS 4,586,350 A * 5/1986 Berdahl ............... F25B 23/003
359/360
5,332,888 A * 7/1994 Tausch ................ B32B 17/1033
219/547

(Continued)

FOREIGN PATENT DOCUMENTS

EP      3423298 A1   1/2019
WO   2016205717 A1  12/2016

OTHER PUBLICATIONS

Herve, et al., "Radiative Cooling by Tailoring Surfaces with Microstructures", In Repository of arXiv:1802.02067, Jan. 11, 2018, 13 Pages.

(Continued)

*Primary Examiner* — Lisa Lea-Edmonds
(74) *Attorney, Agent, or Firm* — Newport IP, LLC; Mike R. Cicero

(57) ABSTRACT

Devices having multiple layers of paint for enhanced thermal performance. Individual paint-layers have specific properties within specific wavelength-ranges. An exemplary device includes an emissive outer layer that has a high emissivity in a first wavelength-range to increase thermal radiation and a high transmittance in a second wavelength-range to reduce solar gain. Underneath the emissive outer layer is a color matching layer that has a high transmittance in the second wavelength-range and absorbs at least some visible light. Underneath the color matching layer is a reflective sublayer that has a high reflectivity in the second wavelength-range. EM radiation within the second wavelength-range passes through the emissive outer layer and color matching layer before being reflected by the reflective sublayer back into the atmosphere. Thus, solar gain is reduced due to the solar energy within the second wave- (Continued)

length range being reflected off of the device—rather than absorbed as thermal energy.

20 Claims, 6 Drawing Sheets

(51) Int. Cl.
 *G06F 1/20* (2006.01)
 *G06F 1/16* (2006.01)

(56) References Cited

U.S. PATENT DOCUMENTS

| | | | | |
|---|---|---|---|---|
| 5,405,680 | A * | 4/1995 | Chang | C03C 17/22 428/212 |
| 6,405,979 | B1 * | 6/2002 | Cordaro | B64G 1/226 244/171.7 |
| 7,378,124 | B2 * | 5/2008 | Daniels | B08B 1/04 427/487 |
| 8,519,259 | B2 * | 8/2013 | Lin | B82Y 10/00 136/256 |
| 9,274,340 | B2 * | 3/2016 | Lyons | G06F 3/011 |
| 9,709,349 | B2 | 7/2017 | Raman et al. | |
| 9,923,111 | B2 | 3/2018 | Fan et al. | |
| 9,927,188 | B2 | 3/2018 | Liu et al. | |
| 10,070,520 | B2 * | 9/2018 | Tomita | H05K 1/189 |
| 10,606,083 | B2 * | 3/2020 | Lin | G02B 27/0176 |
| 2010/0198322 | A1 * | 8/2010 | Joseph | A61F 7/007 607/108 |
| 2016/0004085 | A1 * | 1/2016 | Stroetmann | G02B 27/017 345/8 |
| 2016/0212879 | A1 * | 7/2016 | Nikkhoo | H05K 7/20127 |
| 2018/0354848 | A1 | 12/2018 | Van overmeere et al. | |
| 2019/0331928 | A1 * | 10/2019 | Lin | G02B 27/0176 |

OTHER PUBLICATIONS

Ko, et al., "Metamaterial-Based Radiative Cooling: Towards Energy-Free All-Day Cooling", In Journal of Energies, vol. 12, Issue 1, Dec. 28, 2018, 14 Pages.

Kou, et al., "Daytime Radiative Cooling Using Near-Black Infrared Emitters", In Journal of ACS Photonics, vol. 4, Issue 3, Feb. 3, 2017, 14 Pages.

* cited by examiner

WEARABLE ELECTRONIC DEVICES HAVING MULTIPLE LAYERS OF ELECTROMAGNETIC SPECTRUM SPECIFIC PAINT FOR ENHANCED THERMAL PERFORMANCE

BACKGROUND

Solar gain causes significant thermal management challenges for wearable electronic devices such as, for example, head-mounted display (HMD) devices that are exposed to solar radiation during operation. For example, wearable electronic devices typically have a housing that encloses heat-emitting electronic components. In these cases, the housing serves the thermal management function of dissipating into the surrounding environment some, or even all, of the heat that is internally emitted by the enclosed electronic components. When operating in direct sunlight, solar gain may significantly impair the rate at which the housing dissipates the heat emitted by the enclosed electronic components. This is because in addition to dissipating heat emitted internally by the enclosed electronics, the housing must also continually dissipate heat that results from solar radiation absorption.

The effects of solar gain may be reduced in some cases by designing wearable electronic devices to have a highly reflective outer surface. For example, an outer surface comprised of a polished metal or a white paint may indiscriminately reflect solar radiation (e.g., visible and invisible radiation) rather than absorbing it in the form of heat. Unfortunately, such highly reflective outer layers typically have very low emissivity which results in inefficiencies with respect to radiatively dissipating internally emitted heat. Furthermore, in some cases it is desirable for the outer surface color to be highly customizable even past the limited number of light-colored and highly reflective choices. For example, based on a particular intended field-use, it may be desirable for a wearable electronic device to have an outer surface that is dark-colored and substantially non-reflective in the visible-light spectrum.

It is with respect to these and other considerations that the disclosure made herein is presented.

SUMMARY

Technologies described herein relate to wearable electronic devices having multiple layers of paint (together forming a "paint stack") for enhanced thermal performance. Individual ones of these layers of paint have specific properties within specific electromagnetic (EM) spectrums (i.e., wavelength-ranges). Generally described, some embodiments of the wearable electronic devices disclosed herein include an emissive outer layer that has a high emissivity in a first wavelength-range and a high transmittance in a second wavelength-range. The wearable electronic devices disclosed herein additionally include a reflective sublayer that is disposed over a substrate (e.g., an outer shell of a housing assembly) and underneath the emissive outer layer. The reflective sublayer has a high reflectivity in the second wavelength-range. In this way, EM radiation within the second wavelength-range passes through the emissive outer layer before being reflected by the reflective sublayer back through the emissive outer layer and, ultimately, back into the atmosphere. In this way, solar gain which could potentially result from absorption of solar energy within the second wavelength-range is substantially reduced, or even eliminated, due to the solar energy within the second wavelength range being substantially reflected off of the wearable electronic devices—rather than absorbed as thermal energy.

In addition to the emissive outer layer and the reflective sublayer, the wearable electronic devices disclosed herein further include a color matching layer. The color matching layer may include pigment elements that provide a desired color profile (e.g., visual appearance) for the wearable electronic device. For example, the color matching layer may include pigment elements that yield a dark-blue, dark-brown, or even a camouflage-type color profile. In some embodiments, the color matching layer has a high transmittance in the second wavelength-range and is disposed over the reflective sublayer and underneath the emissive outer layer. Additionally, or alternatively, the color matching layer may be integrated within and/or at least partially overlap with the emissive outer layer.

In an exemplary embodiment, the color matching layer includes black pigment elements that result in the color matching layer being at least partially opaque in the visible light spectrum but also substantially transparent within the second wavelength-range. As a specific but non-limiting example, the color matching layer may be a layer of near-infrared (NIR) transparent paint that includes, for example, perylene black particles that serve as pigment elements. In this way, NIR solar radiation may be substantially reflected off of the wearable electronic device, even while the paint stack provides a color profile that is dark-colored and substantially non-reflective in the visible-light spectrum of solar radiation.

By reflecting some or all of the incident EM radiation within the second wavelength range, the paint stack that is disposed over the wearable electronic device reduces the solar gain (also referred to as "solar heat gain") that occurs within the wearable electronic device. As used herein, the terms "solar gain" and "solar heat gain" refer specifically to an increase in thermal energy of an object that results from solar radiation being absorbed into the object. For example, as the wearable electronic device is struck by sunlight, it will absorb some portion of the sunlight's visible and short-wave components—the result being an increase in the overall thermal energy of the wearable electronic device. Then, the wearable electronic device will dissipate the thermal energy resulting from solar gain by convective heat transfer (e.g., into the air surrounding the wearable electronic device) and/or by re-radiating this heat outward.

Maintaining allowable temperatures at the wearable electronic device requires dissipating thermal energy at least as quickly as it is being absorbed both externally from solar radiation and internally from computing electronics. Since the heat dissipation capabilities of any particular object are inherently limited (e.g., by the emissivity of the object, the thermal conductivity of the object, etc.), reducing the effects of solar gain on the wearable electronic device will increase the rate at which the wearable electronic device is able to passively dissipate heat that is being emitted internally from heat-emitting electronics. Thus, reducing the solar gain of a wearable electronic device according to the techniques described herein improves the thermal management capabilities of the wearable electronic device—even in embodiments having dark-colored and substantially non-reflective visual appearances. This improves the computing performance of the wearable electronic device by mitigating the need to throttle performance of and/or power down the electronics due to extreme internal temperatures—which many electronic are designed to do when temperature thresholds are reached (e.g., as measured with various internally positioned thermocouple sensors). Furthermore, reducing the solar gain of a wearable electronic device also protects the user from burns and poor thermal comfort due to extreme external surface temperatures.

An exemplary wearable electronic device having multiple layers of paint that have specific properties within specific EM spectrums for enhanced thermal performance may be in the form of a head-mounted display (HMD) device. The HMD device may comprise a housing assembly enclosing various computing components—some or all of which emit heat during operation. Exemplary such computing components include, but are not limited to, central processing units (CPUs), graphics processing units (GPUs), Light Emitting Diodes (LEDs), and/or batteries. The HMD device also comprises a support element that is coupled to the housing assembly to enable the housing assembly to be worn by the user at an appropriate location of the user's body. To illustrate this point, presume that the HMD device further includes a display that is mechanically coupled to the housing assembly and that is deployed to generate imagery within a field-of-view of the user during operation of the HMD device. In such an embodiment, the support element may be usable to mount (e.g., removably attach) the housing assembly to the user's head to maintain the display within the field-of-view of the user.

Various components of the HMD device may be constructed from materials which exhibit undesirable properties in terms of, for example, emissivity, color profile, transmittance, and/or reflectance. Furthermore, traditional techniques of priming the various components and then painting them with one or more layers of a single paint to achieve a desired color profile may be ill-suited to controllably modulate these properties individually and, therefore, may be unable to achieve a desired combination of these properties. Accordingly, the techniques disclosed herein enable a plurality of different paints to be applied—each layer have unique properties and each layer being deposited in a particular order with respect to the other layer(s) so as to form a "paint stack" that has the desired combination of properties in terms of emissivity, color profile, transmittance, and/or reflectance.

In some embodiments, an exemplary paint stack that may be formed over the HMD device may include a reflective sublayer that is deposited onto the HMD device prior to other layers of the paint stack. The reflective sublayer may be deposited directly over the top of the material(s) from which the HMD device is constructed. Additionally, or alternatively, the reflective sublayer may be deposited over a primer layer that is first deposited onto the HMD device to improve adherence of the reflective sublayer to the HMD device. In some embodiments, the reflective sublayer may have a reflectivity of 0.9 or higher within a solar IR wavelength-range of 0.8 µm-2.5 µm. Thus, in such an embodiment at least 90% of incident EM radiation which strikes the reflective sublayer and that is within this solar IR wavelength-range range will be reflected off of the reflective sublayer rather than absorbed thereby.

The exemplary paint stack formed over the HMD device may further include a color matching layer that is disposed over the reflective sublayer. The color matching layer may have a transmittance of 0.8 or higher within at least a portion of the solar IR wavelength-range of 0.8 µm-2.5 µm while being at least partially opaque within the visible light wavelength-range (e.g., 0.38 µm-0.74 µm). Furthermore, the color matching layer may have embedded therein pigment elements that provide a desired color profile (e.g., visual appearance) for the HMD device. In this way, the color matching layer may transmit at least 80% of incident EM radiation within this solar IR wavelength-range while substantially absorbing certain wavelengths of visible light so as to yield the desired color profile.

The exemplary paint stack formed over the HMD device may further include an emissive outer layer that is disposed directly over the color matching layer. In some embodiments, the emissive outer layer may have an emissivity of 0.98 or greater in the EM range of 6 µm-25 µm while also having an absorptivity of 0.1 or less within the solar IR wavelength-range of 0.8 µm-2.5 µm. In this way, EM radiation within the solar IR wavelength-range of 0.8 µm-2.5 µm passes through both the emissive outer layer and the color matching layer before being reflected by the reflective sublayer. Then, once reflected, the EM radiation within this solar IR wavelength-range passes again through the color matching layer and the emissive outer layer and back into the atmosphere. In this way, solar gain which could potentially result from absorption of solar energy within solar IR wavelength-range of 0.8 µm-2.5 µm is substantially reduced, or even eliminated, since the exemplary paint stack substantially reflects this specific EM wavelength range. Furthermore, even while substantially reflecting solar energy within solar IR wavelength-range, the paint stack described herein provides a desired color profile which is highly customizable and also maximizes the radiative cooling of the wearable electronic devices that are coated with the disclosed paint stacks.

These and various other features will be apparent from a reading of the following Detailed Description and a review of the associated drawings. This Summary is provided to introduce a selection of concepts in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with another number included within a parenthetical (and/or a letter without a parenthetical) to refer to each individual item. Generic references to the items may use the specific reference number without the sequence of letters.

DETAILED DESCRIPTION

Figure 1:
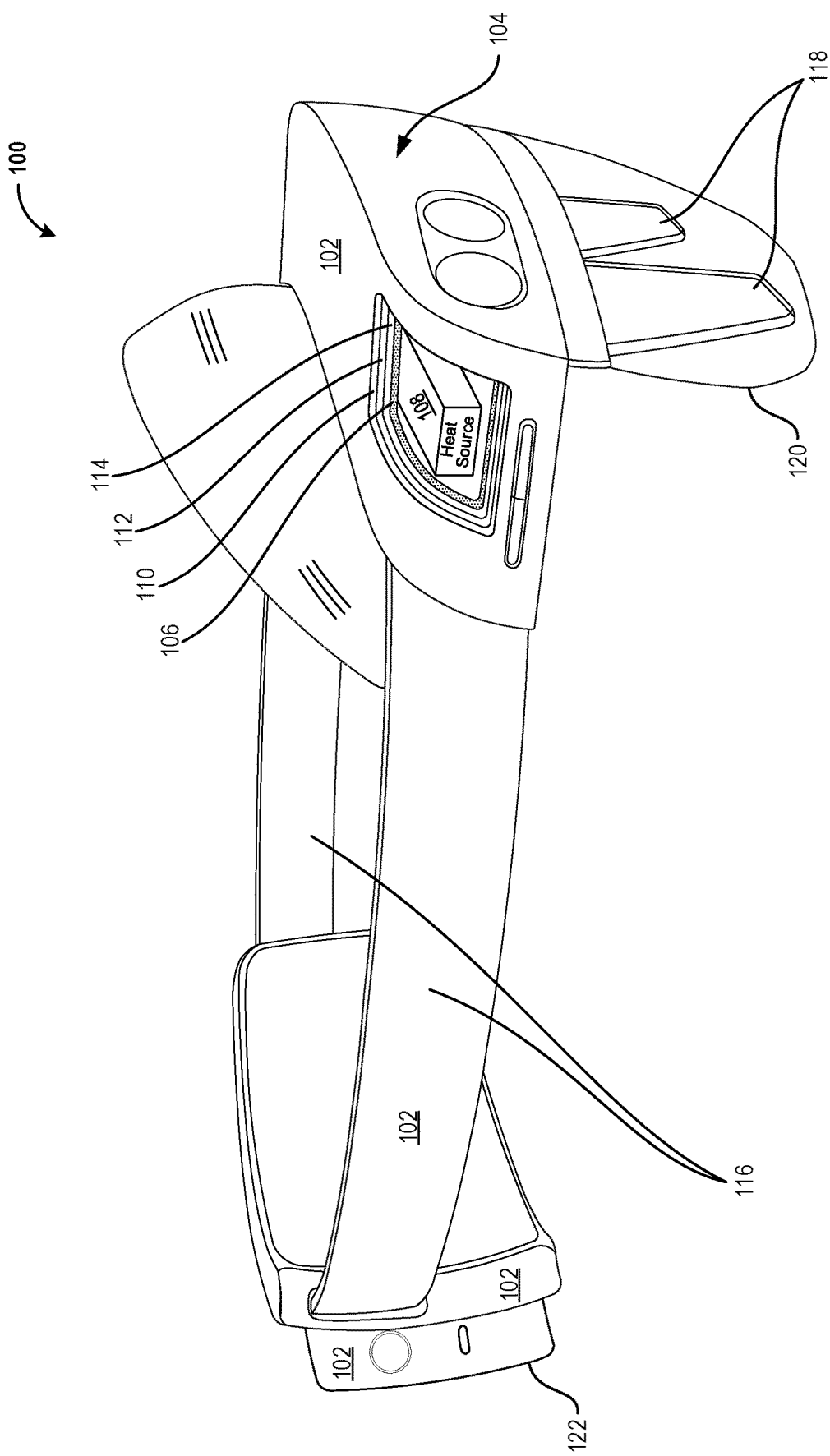
FIG. 1 illustrates an exemplary wearable electronic device (shown in the form of a head-mounted-display (HMD) device) having multiple layers of paint that together form a paint stack that enhances the thermal performance of the exemplary wearable electronic device.

This Detailed Description describes techniques for forming a "paint stack" on physical objects to obtain a desired color profile as well as each of desired emissivity properties within a first electromagnetic (EM) spectrum and desired reflectivity properties within a second EM spectrum. Generally described, an exemplary paint stack may include an emissive outer layer that has a high emissivity in the first EM spectrum and a high transmittance in the second EM spectrum. The exemplary paint stack may further include a reflective sublayer that has a high reflectivity in the second EM spectrum. The reflective sublayer may be disposed over a substrate (e.g., an outer shell of a housing assembly) and underneath the emissive outer layer. The reflective sublayer has a high reflectivity in the second EM spectrum so that EM radiation within the second EM spectrum that passes through the emissive outer layer is substantially reflected by the reflective sublayer back into the atmosphere.

In addition to the emissive outer layer and the reflective sublayer, the exemplary paint stack may further include a color matching layer with pigment elements that provide a desired color profile (e.g., visual appearance) for the physical object on which the paint stack is deposited. In some embodiments, the color matching layer is disposed in between the reflective sublayer and the emissive outer layer and has a low absorptivity in the second EM spectrum. As a specific but non-limiting example, the color matching layer may be a layer of near-infrared (NIR) transparent paint that is disposed between the reflective sublayer and the emissive outer layer. An exemplary NIR transparent paint may include perylene black particles that serve as pigment elements.

In this way, NIR solar radiation may be substantially reflected off of the wearable electronic device, even while the paint stack provides a color profile that is dark-colored and substantially non-reflective in the visible-light spectrum of EM radiation. This reduces the effects of solar gain due to the solar energy within the second EM spectrum being substantially reflected—rather than absorbed as thermal energy. Furthermore, the high emissivity in the first EM spectrum of the emissive outer layer increases the rate of radiative cooling off from the physical object on which the paint stack is deposited.

The techniques disclosed herein are widely applicable to a variety of approaches for utilizing specialized paint stacks to improve the thermal management capabilities for various physical objects. Numerous aspects of the techniques disclosed herein are described in the specific context of depositing a multilayered "paint stack" to a housing assembly of an head-mounted display (HMD) device to provide a desired color profile, while also maximizing the radiative cooling from the HMD device and minimizing the solar gain at the HMD device. While the presently disclosed techniques are not necessarily limited to such embodiments, an appreciation of various aspects of the techniques disclosed herein is readily gained through a discussion of examples in this specific context of HMD devices.

As used herein, the term "radiative cooling" when used in connection with a physical object (e.g., the HMD device 100) refers to the loss of thermal energy (i.e., heat) by the emission of EM radiation. It will be appreciated the EM radiation associated with this loss in thermal energy may be in the form of thermal radiation, i.e., EM radiation generated by the thermal motion of particles of the physical object.

As used herein, the terms "solar gain" and "solar heat gain" refer specifically to an increase in thermal energy of an object that results from solar radiation being absorbed into the object. For example, as an object is struck by sunlight, it will absorb some portion of the sunlight's visible and short-wave components—the result being an increase in the overall thermal energy of the object. Then, the object will dissipate the thermal energy resulting from solar gain by convective heat transfer (e.g., into the air surrounding the wearable electronic device) and/or by re-radiating this heat outward.

As used herein, the terms "absorptivity" or "absorbance" when used in connection with a physical object refers to the effectiveness of the physical object in absorbing energy in the form of electromagnetic radiation. A perfect blackbody absorber is defined to have an absorptivity of one. Absorptivity is a function of wavelength. As used herein, the phrase "high absorptivity," when used to describe the properties of a material or structure within a certain wavelength range, means that the material or structure has an absorptivity of greater than about 0.9 in that range. As used herein, the phrase "low absorptivity," when used to describe the properties of a material or structure within a certain wavelength range, means that the material or structure has an absorptivity of less than about 0.1 in that range.

As used herein, the term "emissivity" when used in connection with a physical object refers to the effectiveness of the physical object (or outermost surface thereof) in emitting energy in the form of EM radiation such as thermal radiation. The emissivity of an object may be express on a scale of 0 to 1. A perfect black body emitter is defined as having an emissivity of 1 whereas a perfect non-emitter is defined as having an emissivity of 0. The emissivity of an object may vary across wavelength. For example, a physical object may have a first emissivity at a first wavelength and a second emissivity at a second wavelength. As used herein, the term "high emissivity" and/or "highly emissive" when used to describe properties of an object within a particular EM spectrum (e.g., particular wavelength-range) refers to that object having an emissivity of 0.9 or higher within that EM spectrum.

As used herein, the term "reflectivity" when used in connection with a physical object refers to the fraction of incident EM radiation that is reflected off of the surface of the physical object. A perfect reflector is defined as having a reflectivity of 1 (and therefore an emissivity of 0), whereas a perfect absorber is defined as having a reflectivity of 0 (and therefore an emissivity of 1). The reflectivity of an object may vary across wavelength. For example, a physical object may have a first reflectivity at a first wavelength and a second reflectivity at a second wavelength. As used herein, the term "high reflectivity" and/or "highly reflective" when used to describe properties of an object within a particular EM spectrum refers to that object having a reflectivity of 0.9 or higher within that EM spectrum.

As used herein, the term "transmittance" when used in connection with a physical object refers to the fraction of incident EM radiation that is transmitted through the physical object. A perfectly opaque material or object is defined as having a transmittance of zero ("0"). A perfectly transparent material or object is defined as having a transmittance of one ("1"). As used herein, the term "high transmittance"

and/or "highly transmitant of" when used to describe properties of an object within a particular EM spectrum refers to that object having a transmittance of 0.6 or higher within that EM spectrum. For example, the color matching layer described below may aptly be described as having a high transmittance within a particular wavelength range when the transmittance within that wavelength-range is equal to or greater than 0.6 or 60%.

As used herein, the term "about" or "approximately" means within an acceptable error range for the particular value as determined by one of ordinary skill in the art, which will depend in part on how the value is measured or determined, i.e., the limitations of the measurement system. For example, "about" can mean a range of up to 20%, up to 10%, up to 5%, and or up to 1% of a given value.

Turning now to FIG. 1, illustrated is an exemplary HMD device 100 having multiple layers of paint that together form a paint stack 102 that enhances the thermal performance of the HMD device 100. As described in more detail below, the paint stack 102 provides a desired color profile for the HMD device 100 while increasing the emissivity of the HMD 100 within a first EM spectrum and increasing the reflectivity of the HMD device 100 within a second EM spectrum. In this way, the effects of solar gain on the HMD device 100 are reduced and the rate of radiative cooling off from the HMD device 100 is increased.

In the illustrated example, the paint stack 102 is disposed over an outer shell 106 of a housing assembly 104. As described above, the paint stack 102 includes multiple layers of paint—individual ones of which have specific properties within specific electromagnetic (EM) spectrums (i.e., wavelength-ranges). As further illustrated, enclosed within the housing assembly 104 is one or more heat sources 108. For example, the housing assembly 104 may at least partially enclose various computing components—some or all of which emit heat during operation. Exemplary such computing components include, but are not limited to, central processing units (CPUs), graphics processing units (GPUs), Light Emitting Diodes (LEDs), and/or batteries. As described above, maintaining allowable temperatures at the HMD device 100 requires dissipating thermal energy at least as quickly as it is being absorbed—both internally from the heat source 108 and externally via solar gain. It should be appreciated that in FIG. 1 the HMD device 100 is shown with a cut-away section to expose the heat source(s) 108 as well as the individual layers of the paint stack 102 (i.e., emissive outer layer 110, color matching layer 112, and reflective sublayer 114).

To increase the radiative cooling capabilities of the HMD device 100, the paint stack 102 includes an emissive outer layer 110 that has a high emissivity within at least some portion of the EM spectrum. In some embodiments, the emissive outer layer 110 has a high emissivity in a first EM spectrum (e.g., wavelength-range) and a low absorptivity in a second EM spectrum. Thus, the emissive outer layer 110 may serve to increase the rate of radiative cooling that occurs within the first EM spectrum—thereby improving the thermal performance of the HMD device 100 in this respect. Furthermore, due to the low absorptivity in the second EM spectrum, the emissive outer layer 110 may transmit a substantial portion of incident EM radiation within the second EM spectrum.

To decrease the solar gain that results from incident solar radiation, the paint stack 102 includes a reflective sublayer 114 that is disposed below the emissive outer layer 110. That is, the reflective sublayer 114 is disposed closer to the outer shell 106 than the emissive outer layer 110. In some embodiments, the reflective sublayer 114 has a high reflectivity within the second EM spectrum so that EM radiation within the wavelength-range defined by this second EM spectrum is substantially reflected by the reflective sublayer 114—rather than being absorbed thereby as thermal energy. Thus, solar gain which could potentially result from absorption of solar energy within the second EM spectrum is substantially reduced, or even eliminated.

In the illustrated example, the paint stack 102 includes a color matching layer 112 disposed underneath the emissive outer layer 110 and above the reflective sublayer 114. The color matching layer provides a desired color profile (e.g., visual appearance) for the paint stack 102 and, therefore, any object onto which the paint stack 102 is deposited. For example, the color matching layer 112 may include pigment elements that yield a dark-blue, dark-brown, or even a camouflage type color profile. In some embodiments, the color matching layer 112, that is disposed between the emissive outer layer 110 and the reflective sublayer 114, has a high transmittance in the second EM spectrum (e.g., a transmittance of 0.6 or greater, 0.65 or greater, 0.7 or greater, and so on). Thus, EM radiation that is incident to the paint stack 102 and that is within the second EM spectrum passes through both of the emissive outer layer 110 and the color matching layer 112 at a high rate of transmission before being reflected off of the reflective sublayer 114 back out to the atmosphere. By reflecting some or all of the incident EM radiation within the second EM spectrum, the paint stack 102 that is disposed over the HMD device 100 reduces the solar gain that occurs within the wearable electronic device. For example, it will be appreciated that objects which are highly absorbent of EM radiation within the solar IR wavelength-range of 0.8 µm-2.5 µm may be subjected to a high degree of solar gain while, assuming all other properties remain constant, other objects that reflect this EM radiation will be subjected to a relatively lower degree of solar gain.

As illustrated, the HMD device 100 also comprises a support element 116 that is coupled to the housing assembly to enable the housing assembly to be worn by the user at an appropriate location of the user's body. To illustrate this point, presume that the HMD device further includes a display that is mechanically coupled to the housing assembly and that is deployed to generate imagery within a field-of-view of the user during operation of the HMD device. In such an embodiment, the support element may be usable to mount (e.g., removably attach) the housing assembly to the user's head to maintain the display within the field-of-view of the user.

The HMD device 100 further includes a display 118 to generate images in front of a user's eye(s) for augmented reality (AR) and/or virtual reality (VR) applications. In embodiments where the HMD device 100 is usable for AR applications, the display 118 may be a transparent display element that enables the user to view the real-world environment while concurrently viewing AR content (e.g., computer generated images). In embodiments where the HMD device 100 is usable for VR applications, the display 118 may be an opaque display element that replaces the user's view of the real-world environment with VR content (e.g., computer generated images). The illustrated HMD device 100 further includes a transparent visor 120 for protecting the display 118 and/or for protecting the user's eyes when the HMD device 100 is being worn by the user during operation.

The HMD device 100 further includes one or more support elements 116 that are configured to maintain the housing assembly 104 at a particular position with respect to a body part of the user during operation. Here, the support elements 116 are coupled to the housing assembly 104 in a specific manner that enables the HMD device 100 to be worn by the user. More specifically, the support elements 116 are usable to mount the housing assembly 104 to the user's head at a location so as to maintain the display 118 within the field-of-view of the user.

In some embodiments, the one or more support elements 116 are further coupled to a secondary housing assembly 122 of the HMD device 100. Similar to the housing assembly 104, the secondary housing assembly 122 may at least partially encloses one or more other heat sources. For example, the secondary housing assembly 122 may enclose a battery that supplies electrical power to the various electronic components of the HMD device 100. The battery may of course act as a heat source whenever it is being charged and/or discharged, e.g., while supplying power to the HMD device 100. It will be appreciated that when properly worn during operation, the housing assembly 104 may be securely mounted to the front of a user's head whereas the secondary housing assembly 122 may be securely mounted to the rear of the user's head. As illustrated, the paint stack 102 that is shown in the cut-away fashion to expose the various layers thereof and to further expose the heat source 108 that is disposed within the housing may also be deposited over one or more of the secondary housing 122 and/or the support assembly 116 to further improve the thermal performance at these components of the HMD device 100. It should be appreciated that the individual layers of the paint stack 102 are not necessarily shown in any particular scale.

Figure 2:
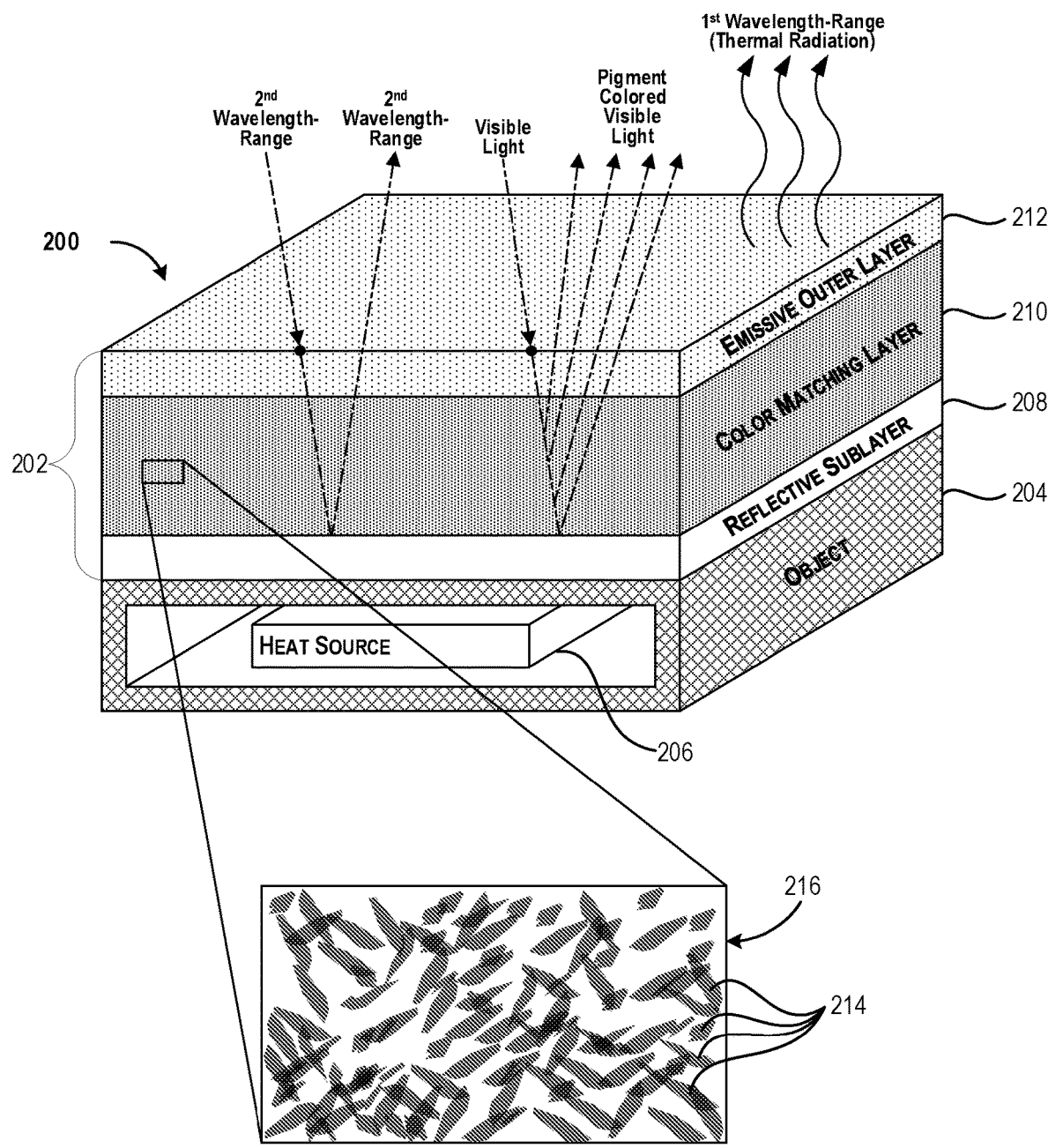
FIG. 2 illustrates a three-layered paint stack that is deposited over an object to provide a desired color for the object while also enhancing the thermal performance of the object.

Turning now to FIG. 2, illustrated is a system 200 having a three-layered paint stack 202 that is deposited over an object 204 to provide a desired color for the object 204 while also enhancing the thermal performance of the object 204. As described above, in various embodiments, the object 204 may be a component of an electronic device within which one or more heat sources 206 are enclosed. For example, the object 204 may be a housing assembly of an augmented-reality (AR) head-mounted-display (HMD) device as shown and described in relation to FIG. 1. As illustrated, the three-layered paint stack 202 may include a reflective sublayer 208 that is deposited directly over the object 204, a color matching layer 210 that is deposited directly over the reflective sublayer 208, and an emissive outer layer 212 that is deposited directly over the color matching layer 210.

In some embodiments, the emissive outer layer 212 has a high emissivity in a first wavelength-range while also having a low absorptivity in a second wavelength-range. Thus, as illustrated, the emissive outer layer 212 emits heat from the three-layered paint stack 202 in the form of thermal radiation within the first wavelength-range. For example, heat that is generated by the heat source 206 that is at least partially enclosed within the object 204 may be conductively transferred through each of the reflective sublayer 208, the color matching layer 210, and ultimately into the emissive outer layer 212. Then, this internally emitted heat that is conductively passed from the object 204 into the emissive outer layer 212 may be continually thermally radiated off of the exemplary three-layered paint stack 202.

In some embodiments, the emissive outer layer 212 may be a polymer-based material that has embedded therein both of an emissivity enhancing particles. Exemplary such emissivity enhancing particles may include, but are not limited to, aluminum oxide (Al2O 3), silicon dioxide (SiO2), calcium carbonate (CaCO3), silicon nitride (SiNx) (e.g., Si3N4), and/or a combination thereof. Embedding the nanoparticles into the emissive outer layer 212 may increase emissivity of the emissive outer layer 212 in the EM range of 6 μm-25 μm.

As further illustrated, incident EM radiation that is within the second wavelength-range and that strikes the emissive outer layer 212 is transmitted through the emissive outer layer 212 rather than being absorbed thereby. It will be appreciated that in embodiments in which the second wavelength-range includes a spectrum of solar light corresponding to invisible near infrared (NIR) radiation, the low absorptivity of the emissive outer layer 212 within the second wavelength-range prevents this invisible NIR radiation from being absorbed into the emissive outer layer 212 as thermal energy. In this way, the low absorptivity of the emissive outer layer 212 within the second wavelength-range serves to reduce the solar gain experienced by the exemplary three-layered paint stack 202.

In some embodiments, the color matching layer 210 may have a high transmittance within the second wavelength-range and may also provide a desired color profile (e.g., visual appearance) for the object 204 within the visible light wavelength-range (e.g., 0.38 μm-0.74 μm). For example, the color matching layer 210 may have embedded therein a plurality of pigment elements 214 that are substantially transparent to the second wavelength-range while also absorbing an appropriate portion of visible light so as to provide the desired color profile (e.g., hue). Thus, as illustrated, EM radiation that is within the second wavelength-range and that reaches the color matching layer 210 after having been transmitted through the emissive outer layer 212 is then transmitted through the color matching layer 210 to the reflective sublayer 208. As further illustrated, at least some EM radiation that is within the visible light wavelength-range (e.g., 0.38 μm-0.74 μm) passes through the emissive outer layer 212 and at least some of the color matching layer 210. As the EM radiation within the visible light wavelength-range (e.g., 0.38 μm-0.74 μm) passes through the color matching layer 210, one or more particular wavelengths are absorbed by the color matching layer 210 while other wavelengths are reflected and or transmitted thereby. In this way, the remaining (e.g., non-absorbed) portion of the visible light wavelength-range that exits the three-layered paint stack 202 (e.g., labeled "Pigment Colored Visible Light") results in the object 204 having the desired color profile (e.g., hue).

In a specific but non-limiting example, the pigment elements 214 may include perylene black particles as may be found in various paint coatings that are transparent to invisible infrared and/or invisible near-infrared (NIR) radiation and that further serve as a pigment to visible light. Thus, while providing the desired color profile by absorbing some portion of the visible light spectrum, the color matching layer 210 may transmit substantially all invisible infrared and/or invisible near-infrared (NIR) radiation to the reflective sublayer 208.

As used herein, the term "pigment" refers to any substance that absorbs at least some wavelengths of visible light. In this way, the visual appearance or hue for any given pigment results from the wavelength(s) of visible light that are not absorbed. It will be appreciated that a black pigment may absorb all or substantially all wavelengths of visible light.

Shown in FIG. 2 is an enlarged view 216 of a particular portion of the color matching layer 210. The pigment elements 214 may be included within the color matching layer 210 at a pigment density that is selected so as to provide the desired color profile. For example, under circumstances where the pigment elements 214 are the perylene black elements, it will be appreciated that embedding the pigment elements 214 within the color matching layer 210 at a high density may yield a darker hue as compared to if the pigment elements 214 were embedded within the color matching layer 210 at a relatively lower density. This is because by increasing (or decreasing) the density of a pigment within a paint layer, the proportion of visible light that falls within a particular wavelength-range that is absorbed by the paint layer may be increased (or decreased).

In some embodiments, the reflective sublayer 208 is disposed directly underneath the color matching layer 210 and has a high reflectivity within the second wavelength-range that each of the emissive outer layer 212 and the color matching layer 210 have a high transmittance in. Thus, as illustrated, EM radiation within the second wavelength-range that is incident to the exemplary three-layered paint stack 202 is substantially transmitted through both of the emissive outer layer 212 and the color matching layer 210 before being reflected by the reflective sublayer 208 back into the atmosphere. In this way, solar gain which could potentially result from absorption of solar energy within the second wavelength-range is substantially reduced, or even eliminated, due to the solar energy within the second wavelength range being substantially reflected by the exemplary three-layered paint stack 202—rather than absorbed as thermal energy.

In a specific but non-limiting embodiment, the emissive outer layer 212 may have an emissivity of 0.98 or higher within a wavelength-range of 6 μm-25 μm while also having an absorptivity of 0.1 or less within a solar IR wavelength-range of 0.8 μm-2.5 μm. Furthermore, in this specific embodiment, the color matching layer 210 may have an average transmittance of 0.6 or higher within a solar IR wavelength-range of 0.8 μm-2.5 μm while the reflective sublayer 208 has a reflectivity of 0.9 or higher within a solar IR wavelength-range of 0.8 μm-2.5 μm. Furthermore, in this specific embodiment, the emissive outer layer 212 is at least partially transparent to visible light. Thus, as illustrated, at least some visible light will pass through the emissive outer layer 212 before at least some wavelengths of within the visible light spectrum are absorbed by the color matching layer 210. Then, the remaining wavelengths of visible light (i.e., those that are not absorbed by the color matching layer 210 may transmitted back through the emissive outer layer 212 into the atmosphere. In this way, the color matching layer 210 serves to provide the desired color profile for the object 204. Furthermore, in this specific embodiment, the solar IR wavelength-range of 0.8 μm-2.5 μm (or at least a substantial portion thereof) is reflected by the three-layered paint stack 202.

Figure 3:
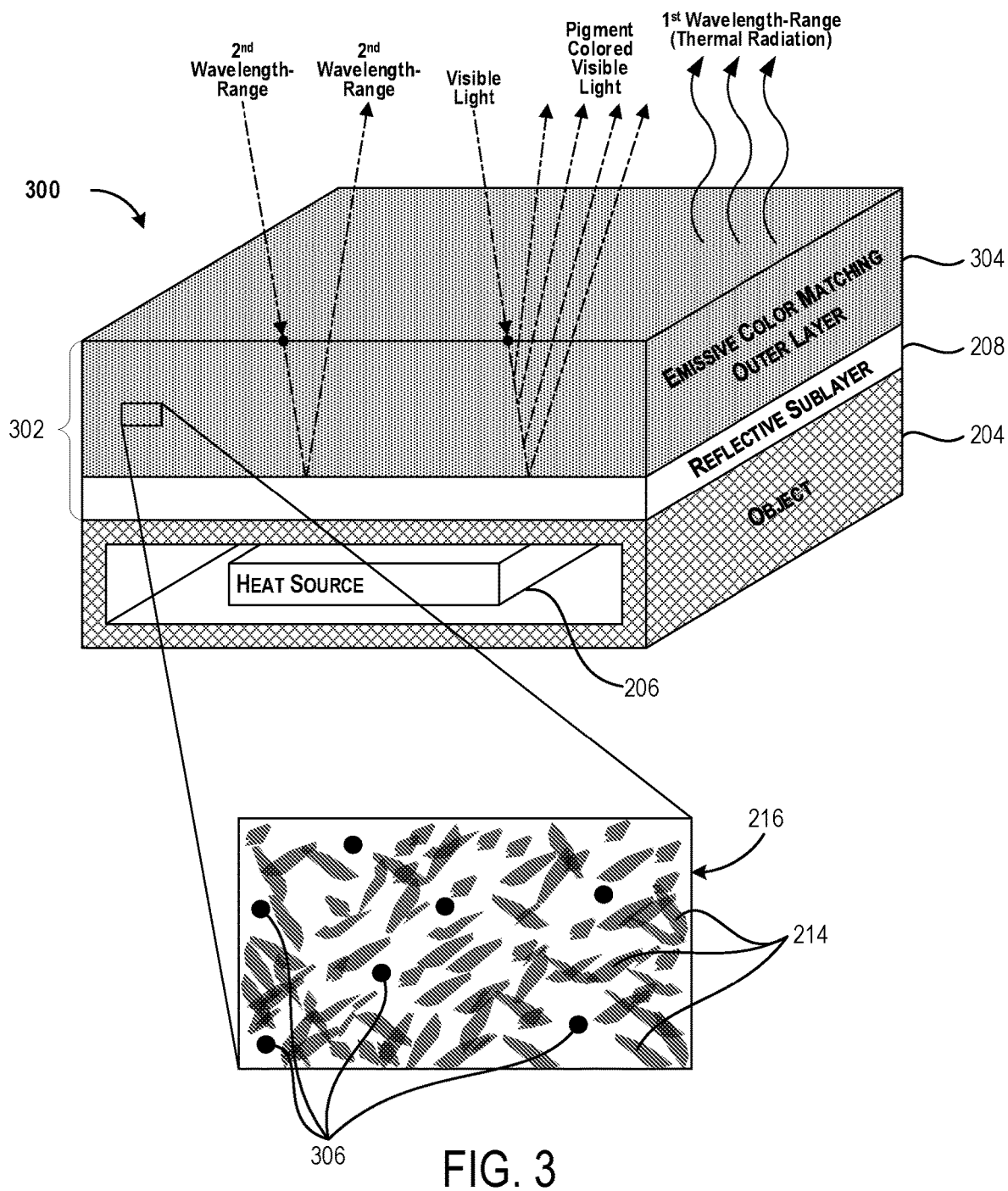
FIG. 3 illustrates a two-layered paint stack that is deposited over an object to provide a desired color for the object while also enhancing the thermal performance of the object.

Turning now to FIG. 3, illustrated is a system 300 having a two-layered paint stack 302 that is deposited over an object 204 to provide a desired color for the object 204 while also enhancing the thermal performance of the object 204. As illustrated, the two-layered paint stack 302 may include a reflective sublayer 208 that is deposited over the object 204. As further illustrated, the two-layered paint stack 302 may include an emissive color matching outer layer 304 that is deposited over the reflective sublayer 208. The reflective sublayer 208 shown in FIG. 3 is similar to that shown in FIG. 2 and is therefore similarly numbered.

In some embodiments, the emissive color matching outer layer 304 has a high emissivity in a first wavelength-range while also having a low absorptivity in a second wavelength-range. Thus, as illustrated, the emissive color matching outer layer 304 emits heat from the two-layered paint stack 302 in the form of thermal radiation within the first wavelength-range. For example, as described with respect to FIG. 2, heat that is generated by the heat source 206 may be conductively transferred through the reflective sublayer 208 and then emitted via the emissive color matching outer layer 304 due to the high emissivity in the first wavelength-range. As further illustrated, incident EM radiation that is within the second wavelength-range and that strikes the emissive color matching outer layer 304 is transmitted through the emissive color matching outer layer 304 rather than being absorbed thereby. In this way, the low absorptivity of the emissive color matching outer layer 304 within the second wavelength-range serves to reduce the solar gain experienced by the exemplary two-layered paint stack 302.

The emissive color matching outer layer 304 may be a polymer-based material that has embedded therein both of an emissivity enhancing particles 306 as well as a plurality of pigment elements 214. The inclusion of the pigment elements 214 may result in the emissive color matching outer layer 304 being absorbent to an appropriate portion of visible light so as to provide the desired color profile—while having a low absorptivity within the second wavelength-range. As described above, in some embodiments, the pigment elements 214 may include perylene black particles as may be found in various paint coatings that are transparent to invisible infrared and/or invisible near-infrared (NIR) radiation and that further serve as a pigment to visible light.

In some embodiments, the emissivity enhancing material 304 is a plurality of nanoparticles which may include, but are not limited to, aluminum oxide ($Al_2O_3$), silicon dioxide ($SiO_2$), calcium carbonate ($CaCO_3$), silicon nitride (SiNx) (e.g., $Si_3N_4$), and/or a combination thereof. The use of nanoparticles can increase emissivity in the EM range of 6 μm-25 μm while also having an absorptivity of 0.1 or less within the solar IR wavelength-range of 0.8 μm-2.5 μm—or at least some subrange of the solar IR wavelength-range of 0.8 μm-2.5 μm.

Furthermore, as described above, the inclusion of the pigment elements 214 may result in the emissive color matching outer layer 304 being substantially transparent to the solar IR wavelength-range of 0.8 μm-2.5 μm and absorbent to an appropriate portion of visible light so as to provide the desired color profile. Thus, the inclusion of both of the emissivity enhancing material 304 and the pigments 214 in the emissive color matching outer layer 304 may result in this layer having a high emissivity in a first wavelength-range and a low absorptivity in a second wavelength-range while also being absorbent of certain wavelengths of visible light so as to reflect a desired color profile out of the exemplary two-layered paint stack 302.

Thus, as illustrated, EM radiation that is within the second wavelength-range and that is incident to the two-layered paint stack 302 will propagate through the emissive color matching outer layer 304 to the reflective sublayer 208. Then, the EM radiation within the second wavelength-range is reflected by the reflective sublayer 208 back through the emissive color matching outer layer 304 and into the atmosphere—thereby preventing solar gain that could otherwise result if the second wavelength-range were instead absorbed.

As further illustrated, at least some EM radiation that is within the visible wavelength-range range (e.g., 0.38 μm-0.74 μm) passes through to at least some depth of the emissive color matching outer layer 304. As the visible light passes through the emissive color matching outer layer 304, at least some particular wavelengths are absorbed (rather than being reflected and/or transmitted). This results in the object 204 having the desired visual appearance (e.g., visual colored hue). In some embodiments, substantially all wavelengths within the visible light wavelength-range are absorbed by the emissive color matching outer layer 304 so that the resulting visual appearance of the object 204 is black in color. Alternatively, the emissive color matching outer layer 304 may absorb only a subset of wavelengths within the visible light wavelength-range. In such cases, resulting visual appearance of the object 204 may result from certain wavelengths of visible light that are reflected and/or transmitted by the emissive color matching outer layer 304.

In a specific but non-limiting embodiment, the emissive color matching outer layer 304 may have an emissivity of 0.98 or higher within a wavelength-range of 6 μm-25 μm while also having an absorptivity of 0.4 or less within a solar IR wavelength-range of 0.8 μm-2.5 μm. Furthermore, in this specific embodiment, the emissive color matching outer layer 304 may have a transmittance of 0.6 or higher within a solar IR wavelength-range of 0.8 μm-2.5 μm while the reflective sublayer 208 has a reflectivity of 0.9 or higher within a solar IR wavelength-range of 0.8 μm-2.5 μm. Furthermore, in this specific embodiment, the emissive color matching outer layer 304 may absorb substantially all of and/or a specific subset of wavelengths of visible light so as to result in the object 204 having a desired visual appearance.

Figure 4:
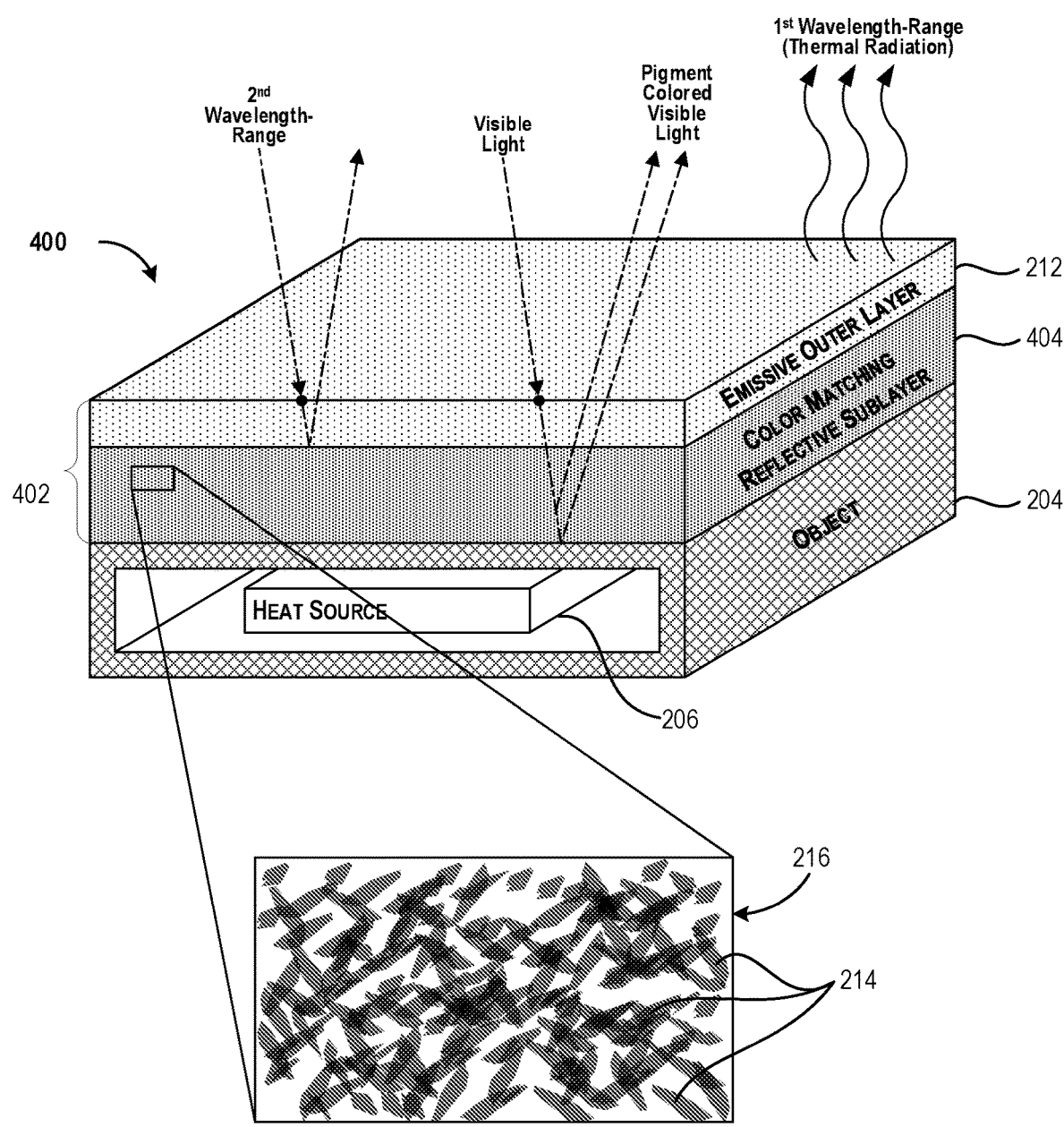
FIG. 4 illustrates an alternate embodiment of a two-layered paint stack that is deposited over an object to provide a desired color for the object while also enhancing the thermal performance of the object.

Turning now to FIG. 4, illustrated is a system 400 having an alternate embodiment of a two-layered paint stack 402 that is deposited over an object 204 to provide a desired color for the object 204 while also enhancing the thermal performance of the object 204. As illustrated, the two-layered paint stack 402 may include a color matching reflective sublayer layer 404 that is deposited over the object 204. As further illustrated, the two-layered paint stack 402 may include an emissive outer layer 212 that is deposited over the color matching reflective sublayer layer 404. The emissive outer layer 212 shown in FIG. 4 is similar to that shown in FIG. 2 and is therefore similarly numbered.

As described in relation to FIG. 2, the emissive outer layer 212 may have a high emissivity in a first wavelength-range while also having a high transmittance in a second wavelength-range. Thus, as illustrated, the emissive outer layer 212 emits heat from the two-layered paint stack 402 in the form of thermal radiation within the first wavelength-range while simultaneously transmitting EM radiation in the second wavelength-range to the color matching reflective sublayer layer 404.

The color matching reflective sublayer layer 404 has a high reflectance in the second wavelength-range. Thus, as illustrated, EM radiation that is within the second wavelength-range is transmitted through the emissivity outer layer 212 and then reflected off of the color matching reflective sublayer 404 back through the emissive outer layer 212 and ultimately into the atmosphere.

In some embodiments, the color matching reflective sublayer 404 includes various pigment elements 214 embedded therein. In this way, the color matching reflective sublayer 404 may absorb an appropriate portion of the spectrum of visible light (e.g., a particular subset of wavelengths of visible light) so as to provide a desired color profile or hue for the object 204.

Thus, as illustrated, EM radiation that is within the second wavelength-range and that is incident to the two-layered paint stack 402 will propagate through the emissive outer layer 212 to the color matching reflective sublayer 404. Then, the EM radiation within the second wavelength-range is reflected by the color matching reflective sublayer 404 back through the emissive outer layer 212 and into the atmosphere—thereby preventing solar gain that could otherwise result if the second wavelength-range were instead absorbed.

As further illustrated, at least some EM radiation that is within the visible wavelength-range range (e.g., 0.38 μm-0.74 μm) may pass through to at least some depth of the color matching reflective sublayer 404. As the visible light passes through the color matching reflective sublayer 404, at least some particular wavelengths are absorbed (rather than being reflected and/or transmitted). This results in the object 204 having the desired visual appearance (e.g., visual colored hue). In some embodiments, substantially all wavelengths within the visible light wavelength-range are absorbed by the color matching reflective sublayer 404 so that the resulting visual appearance of the object 204 is black in color. Alternatively, the color matching reflective sublayer 404 may absorb only a subset of wavelengths within the visible light wavelength-range. In such cases, resulting visual appearance of the object 204 may result from certain wavelengths of visible light that are reflected and/or transmitted by the color matching reflective sublayer 404.

In a specific but non-limiting embodiment, the emissive color matching outer layer 304 may have an emissivity of 0.98 or higher within a wavelength-range of 6 μm-25 μm while also having a transmittance of 0.9 or higher within a solar IR wavelength-range of 0.8 μm-2.5 μm. Furthermore, in this specific embodiment, the emissive color matching outer layer 304 may have a transmittance of 0.9 or higher within a solar IR wavelength-range of 0.8 μm-2.5 μm while the reflective sublayer 208 has a reflectivity of 0.9 or higher within a solar IR wavelength-range of 0.8 μm-2.5 μm. Furthermore, in this specific embodiment, the emissive color matching outer layer 304 may absorb substantially all of and/or a specific subset of wavelengths of visible light so as to result in the object 204 having a desired visual appearance.

Figure 5A:
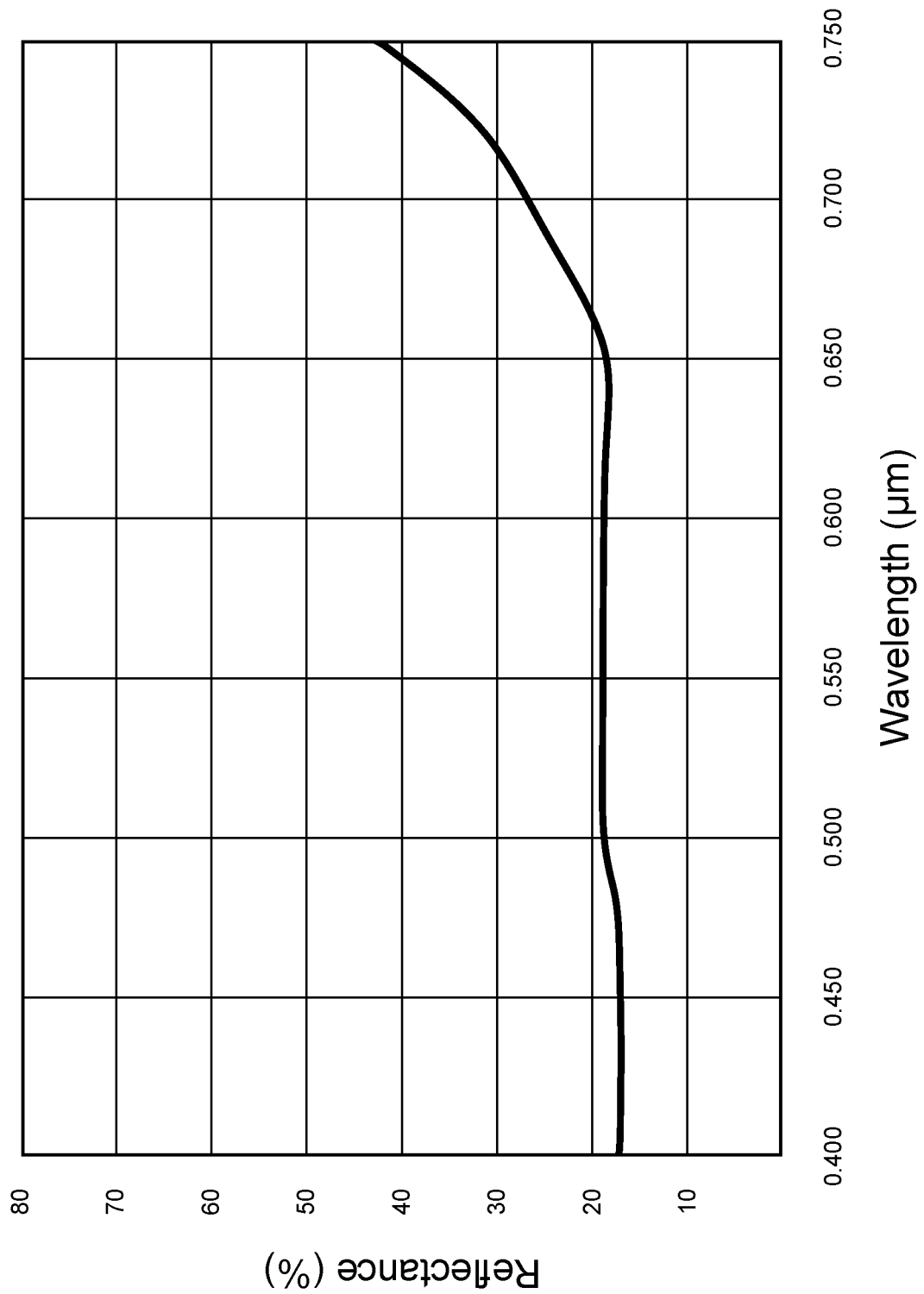
FIG. 5A is a graphical representation of exemplary reflectance values of the three-layered paint stack shown in FIG. 2 within the visible-light spectrum of EM radiation.

Turning now to FIG. 5A, illustrated is a graphical representation of exemplary reflectance values of the three-layered paint stack shown in FIG. 2 within the visible-light spectrum of EM radiation. The reflectance values shown in FIG. 5A specifically correspond to an embodiment of the three-layered paint stack that is configured with a color matching layer that is matched to a tan-brown hue. Specifically, the reflectance values shown in FIG. 5A correspond to the color matching layer being specifically matched to a government color specification known in the industry as "Tan 499."

As illustrated, the reflectance of the three-layered paint stack within the range of 0.400 μm to 0.650 μm remains below 20% (or stated alternatively 0.20). Thus, it will be appreciated that a substantial amount of light within these wavelengths is absorbed (e.g., about 80% or more). As further illustrated, between the spectrum values of 0.650 μm and 0.750 μm, the reflectance of the three-layered paint stack may gradually increase from slightly below 20% up to approximately 42%. Thus, it will be appreciated by one skilled in the art that the visual appearance of the three-layered paint stack may appear brown in hue or color due to the spectral reflectance of the three-layered paint stack within the visible-light spectrum of EM radiation.

It should be appreciated that the reflectance values shown in FIG. 5A are provided for illustrative purposes only are not to be construed as limiting of all embodiment of the three-layered paint stack described herein. For example, in some embodiments, the reflectance values for specific sub-ranges of values within the visible-light spectrum may be greater or less than those graphically represented in FIG. 5A. As a specific but non-limiting example, the reflectance of the three-layered paint stack within the range of 0.400 μm to 0.650 μm remains below 25% (or stated alternatively 0.25) but in at least some subranges (0.425 μm to 0.500 μm) may be above 20%. As another specific but non-limiting example, the reflectance of the three-layered paint stack within the range of 0.400 μm to 0.700 μm may remain below 20%. Furthermore, although the exemplary reflectance values shown in FIG. 5A correspond to a three-layered paint stack, it should be appreciated that similar and/or identical values may be achieved in implementations of either of the two-layered paint stacks described herein.

Figure 5B:
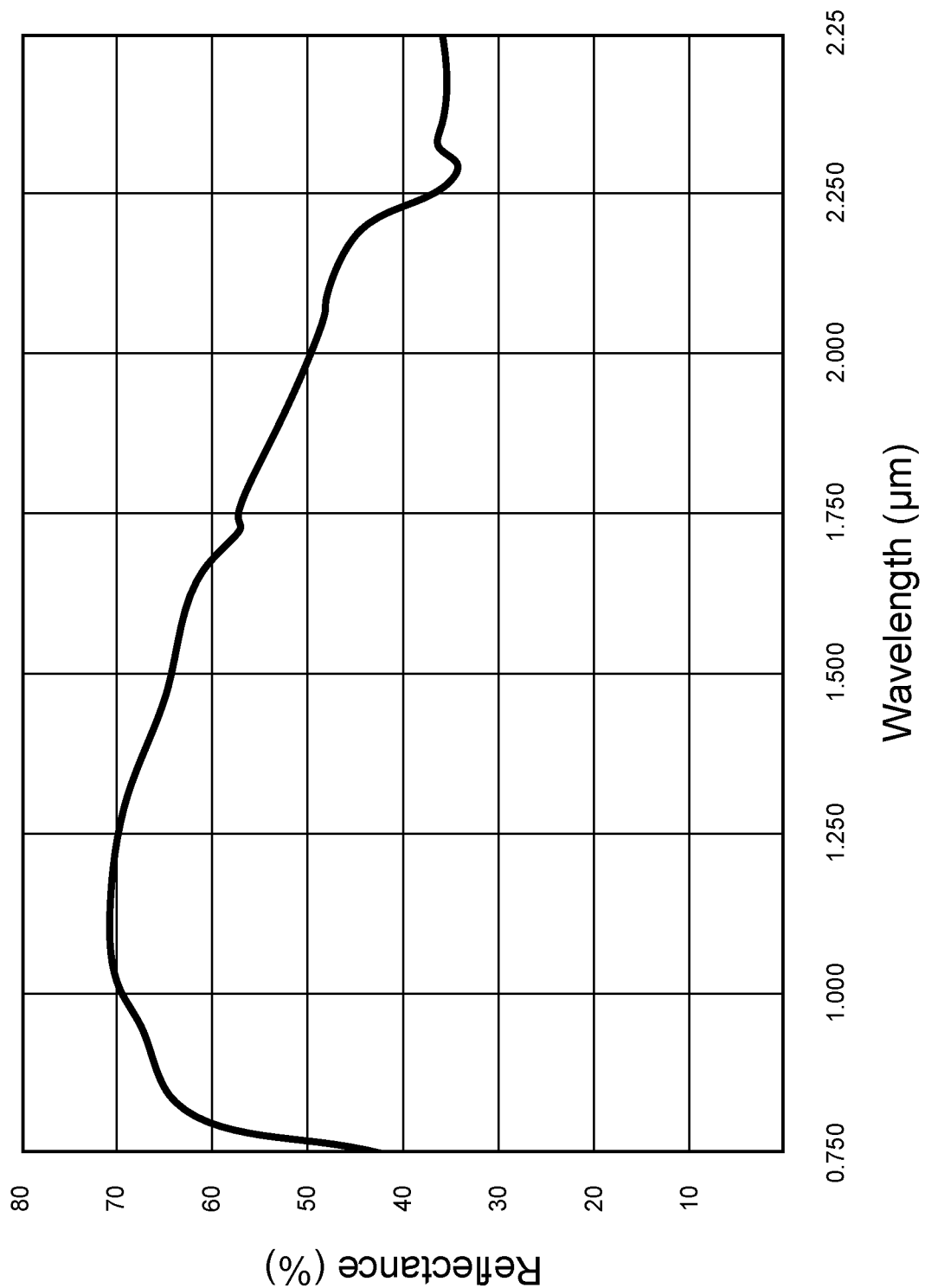
FIG. 5B is a graphical representation of exemplary reflectance values of the three-layered paint stack shown in FIG. 2 within the near-infrared (NIR) spectrum of EM radiation.

Turning now to FIG. 5B, illustrated is a graphical representation of exemplary reflectance values of the three-layered paint stack shown in FIG. 2 within the near-infrared (NIR) spectrum of EM radiation. As illustrated, the reflectance of the three-layered paint stack within the range of 0.750 μm to 0.800 μm rises sharply to over 60% and remains over 60% until roughly the 2.000 μm wavelength. Thus, it can be appreciated that 60% or more of the solar energy that is within this wavelength-range and that falls incident to the three-layered paint stack is reflected off of the three-layered paint stack rather than being absorbed in the form of thermal energy.

As described above, the color matching layer 210 of the three-layered paint structure may include pigment that yield the desired color profile (e.g., visual appearance) as defined by the reflectance values within the visible-wavelength spectrum (e.g., as represented in FIG. 5A). In the three-layered embodiment corresponding to FIGS. 5A and 5B, the color matching layer is disposed in between the reflective sublayer and the emissive outer layer and has a transmittance of over 60% within the wavelength range of 0.800 μm to roughly the 2.000 μm—which is higher than could be achieved using traditional pigments that are not NIR transparent. As described above, in some embodiments, the NIR transparent pigment that is included within the color matching layer may include perylene black particles.

In this way, NIR solar radiation may be substantially reflected off of the wearable electronic device, even while the paint stack provides a color profile that is dark-colored and substantially non-reflective in the visible-light spectrum of EM radiation. This reduces the effects of solar gain due to the solar energy within the second EM spectrum being substantially reflected—rather than absorbed as thermal energy. Furthermore, the high emissivity in the first EM spectrum of the emissive outer layer increases the rate of radiative cooling off from the physical object on which the paint stack is deposited.

It should be appreciated any reference to "first," "second," etc. items and/or abstract concepts within the description is not intended to and should not be construed to necessarily correspond to any reference of "first," "second," etc. elements of the claims. In particular, within this Detailed Description and/or the previous Summary, items and/or abstract concepts such as, for example, wavelength-range and/or emissivity may be distinguished by numerical designations without such designations corresponding to the claims or even other paragraphs of the Summary and/or Detailed Description. For example, any designation of a "first wavelength-range" and "second wavelength-range" within a paragraph of this disclosure is used solely to distinguish two different wavelength-ranges within that specific paragraph—not any other paragraph and particularly not the claims.

Example Clauses

The disclosure presented herein may be considered in view of the following clauses.

Example Clause A, a wearable electronic device, comprising: a housing assembly having an outer shell that at least partially encloses one or more computing components that emit heat during operation; a paint stack that is disposed over the outer shell of the housing assembly, the paint stack including: an emissive outer layer that has a high emissivity in a first wavelength-range and a low absorptivity in a second wavelength-range; a color matching layer, disposed beneath the emissive outer layer, that has the high transmittance in the second wavelength-range and that absorbs at least some wavelengths of visible light to provide a particular color profile for the paint stack; and a reflective sublayer, disposed beneath the color matching layer, that has a high reflectivity in the second wavelength-range.

Example Clause B, the wearable electronic device of Example Clause A, wherein the color matching layer that is disposed between the emissive outer layer and the reflective sublayer includes a plurality of pigment elements that absorb the at least some wavelengths of visible light to provide the particular color profile.

Example Clause C, the wearable electronic device of any one of Example Clauses A through B, wherein the plurality of pigment elements includes at least perylene black particles.

Example Clause D, the wearable electronic device of any one of Example Clauses A through C, wherein the emissive outer layer has an average emissivity of at least 0.9 in a wavelength-range of 6 μm-25 μm.

Example Clause E, the wearable electronic device of any one of Example Clauses A through D, wherein the emissive outer layer has an absorptance of less than 0.1 in a wavelength-range of 0.8 μm-2.5 μm.

Example Clause F, the wearable electronic device of any one of Example Clauses A through E, wherein the paint stack has a first average reflectance of less than 0.75 between 0.3 μm to 0.8 μm, and wherein the paint stack has a second average absorptance less than 0.5 between 0.8 μm to 2.5 μm.

Example Clause G, the wearable electronic device of any one of Example Clauses A through F, wherein the emissive outer layer is a polymer-based material that has embedded therein a plurality of emissivity enhancing particles.

Example Clause H, a wearable electronic device, comprising: a housing assembly having an outer shell that at least partially encloses one or more computing components that emit heat during operation; a paint stack that is disposed over the outer shell of the housing assembly, the paint stack including: an emissive color matching outer layer that has a high emissivity in a first wavelength-range and a high transmittance in a second wavelength-range, wherein the emissive color matching outer layer absorb at least some wavelengths of visible light to provide a particular color profile to the paint stack; and a reflective sublayer that is disposed beneath the emissive color matching outer layer and that has a high reflectivity in the second wavelength-range.

Example Clause I, the wearable electronic device of Example Clause H, wherein the emissive color matching outer layer is a polymer-based material that has embedded therein a plurality of emissivity enhancing particles and a plurality of pigment elements that absorb the at least some wavelengths of visible light to provide the particular color profile.

Example Clause J, the wearable electronic device of any one of Example Clauses H through I, wherein the plurality of pigment elements includes at least perylene black particles.

Example Clause K, the wearable electronic device of any one of Example Clauses H through J, wherein the emissive outer layer is a polymer-based material that has embedded therein the plurality of emissivity enhancing particles.

Example Clause L, the wearable electronic device of any one of Example Clauses H through K, wherein the emissive color matching outer layer that has an average emissivity of at least 0.9 in a wavelength-range of 6 μm-25 μm.

Example Clause M, the wearable electronic device of any one of Example Clauses H through L, wherein the emissive color matching outer layer, wherein the paint stack has an average reflectance of less than 0.75 between 0.3 μm to 0.8 μm, and wherein the paint stack has an average absorptance less than 0.5 between 0.8 μm to 2.5 μm.

Example Clause N, the wearable electronic device of any one of Example Clauses H through M, further comprising a support element to mechanically couple the housing assembly to a body part of a user, wherein the paint stack is disposed over at least a portion of the support element.

Example Clause O, an apparatus, comprising: a housing assembly; a paint stack disposed over the housing assembly, the paint stack comprising: an emissive outer layer that has a high emissivity in a wavelength-range of 6 μm-25 μm and a low absorptivity in a wavelength-range of 0.8 μm-1.9 μm; a color matching layer, disposed beneath the emissive outer layer, that has the high transmittance in the wavelength-range of 0.8 μm-1.9 μm and that absorbs at least some wavelengths of visible light to provide a particular color profile for the paint stack; and a reflective sublayer, disposed beneath the color matching layer, that has a high reflectivity in the wavelength-range of 0.8 μm-1.9 μm.

Example Clause P, the apparatus of Example Clause O, wherein the paint stack has a reflectance of less than 0.2 within wavelength range of 0.400 to 0.650.

Example Clause Q, the apparatus of any one of Example Clauses O through P, wherein the emissive outer layer is a polymer-based material that has embedded therein a plurality of emissivity enhancing particles.

Example Clause R, the apparatus of any one of Example Clauses O through Q, wherein the at least some wavelengths of visible light are absorbed by perylene black particles that are embedded within the color matching layer that is disposed between the emissive outer layer and the reflective sublayer.

Example Clause S, the apparatus of any one of Example Clauses O through R, wherein the emissive outer layer has an emissivity of at least 0.98 in the wavelength-range of 6 μm-25 μm.

Example Clause T, the apparatus of any one of Example Clauses O through S, wherein the color matching layer that is disposed between the emissive outer layer and the reflective sublayer includes a plurality of pigment elements that absorb the at least some wavelengths of visible light to provide the particular color profile.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:

1. A wearable electronic device, comprising:
   a housing assembly having an outer shell that at least partially encloses one or more computing components that emit heat during operation;
   a paint stack that is disposed over the outer shell of the housing assembly, the paint stack including:
      an emissive outer layer that has a high emissivity in a first wavelength-range and a low absorptivity in a second wavelength-range;
      a color matching layer, disposed beneath the emissive outer layer, that has the high transmittance in the second wavelength-range and that absorbs at least some wavelengths of visible light to provide a particular color profile for the paint stack; and
      a reflective sublayer, disposed beneath the color matching layer, that has a high reflectivity in the second wavelength-range.

2. The wearable electronic device of claim 1, wherein the color matching layer that is disposed between the emissive outer layer and the reflective sublayer includes a plurality of pigment elements that absorb the at least some wavelengths of visible light to provide the particular color profile.

3. The wearable electronic device of claim 2, wherein the plurality of pigment elements includes at least perylene black particles.

4. The wearable electronic device of claim 1, wherein the emissive outer layer has an average emissivity of at least 0.9 in a wavelength-range of 6 μm-25 μm.

5. The wearable electronic device of claim 4, wherein the emissive outer layer has an absorptance of less than 0.1 in a wavelength-range of 0.8 μm-2.5 μm.

6. The wearable electronic device of claim 1, wherein the paint stack has a first average reflectance of less than 0.75 between 0.3 μm to 0.8 μm, and wherein the paint stack has a second average absorptance less than 0.5 between 0.8 μm to 2.5 μm.

7. The wearable electronic device of claim 1, wherein the emissive outer layer is a polymer-based material that has embedded therein a plurality of emissivity enhancing particles, and wherein the reflective layer has an average reflectance of greater than 0.5 between 0.8 μm to 2.5 μm.

8. A wearable electronic device, comprising:
   a housing assembly having an outer shell that at least partially encloses one or more computing components that emit heat during operation;
   a paint stack that is disposed over the outer shell of the housing assembly, the paint stack including:
      an emissive color matching outer layer that has a high emissivity in a first wavelength-range and a high transmittance in a second wavelength-range, wherein the emissive color matching outer layer absorb at least some wavelengths of visible light to provide a particular color profile to the paint stack; and
      a reflective sublayer that is disposed beneath the emissive color matching outer layer and that has a high reflectivity in the second wavelength-range.

9. The wearable electronic device of claim 8, wherein the emissive color matching outer layer is a polymer-based material that has embedded therein a plurality of emissivity enhancing particles and a plurality of pigment elements that absorb the at least some wavelengths of visible light to provide the particular color profile.

10. The wearable electronic device of claim 9, wherein the plurality of pigment elements includes at least perylene black particles.

11. The wearable electronic device of claim 9, wherein the emissive outer layer is a polymer-based material that has embedded therein the plurality of emissivity enhancing particles.

12. The wearable electronic device of claim 8, wherein the emissive color matching outer layer that has an average emissivity of at least 0.9 in a wavelength-range of 6 μm-25 μm.

13. The wearable electronic device of claim 12, wherein:
the emissive color matching outer layer, wherein the paint stack has an average reflectance of less than 0.75 between 0.3 μm to 0.8 μm,
the paint stack has an average absorptance less than 0.5 between 0.8 μm to 2.5 μm, and
the reflective layer has an average reflectance of greater than 0.5 between 0.8 μm to 2.5 μm.

14. The wearable electronic device of claim 8, further comprising a support element to mechanically couple the housing assembly to a body part of a user, wherein the paint stack is disposed over at least a portion of the support element.

15. An apparatus, comprising:
a housing assembly;
a paint stack disposed over the housing assembly, the paint stack comprising:
an emissive outer layer that has a high emissivity in a wavelength-range of 6 μm-25 μm and a low absorptivity in a wavelength-range of 0.8 μm-1.9 μm;
a color matching layer, disposed beneath the emissive outer layer, that has the high transmittance in the wavelength-range of 0.8 μm-1.9 μm and that absorbs at least some wavelengths of visible light to provide a particular color profile for the paint stack; and
a reflective sublayer, disposed beneath the color matching layer, that has a high reflectivity in the wavelength-range of 0.8 μm-1.9 μm.

16. The apparatus of claim 15, wherein the paint stack has a reflectance of less than 0.2 within wavelength range of 0.400 to 0.650.

17. The apparatus of claim 15, wherein the emissive outer layer is a polymer-based material that has embedded therein a plurality of emissivity enhancing particles.

18. The apparatus of claim 15, wherein the at least some wavelengths of visible light are absorbed by perylene black particles that are embedded within the color matching layer that is disposed between the emissive outer layer and the reflective sublayer.

19. The apparatus of claim 15, wherein the emissive outer layer has an emissivity of at least 0.98 in the wavelength-range of 6 μm-25 μm.

20. The apparatus of claim 15, wherein the color matching layer that is disposed between the emissive outer layer and the reflective sublayer includes a plurality of pigment elements that absorb the at least some wavelengths of visible light to provide the particular color profile.

\* \* \* \* \*